(12) United States Patent
Cho et al.

(10) Patent No.: US 8,003,999 B2
(45) Date of Patent: Aug. 23, 2011

(54) ORGANIC LIGHT EMITTING DEVICE

(75) Inventors: Yoon-Hyeung Cho, Suwon-si (KR);
Jong-Hyuk Lee, Suwon-si (KR);
Won-Jong Kim, Suwon-si (KR);
Min-Ho Oh, Suwon-si (KR);
Byoung-Duk Lee, Suwon-si (KR);
Jin-Baek Choi, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 251 days.

(21) Appl. No.: 11/646,948

(22) Filed: Dec. 28, 2006

(65) Prior Publication Data

US 2007/0152212 A1    Jul. 5, 2007

(30) Foreign Application Priority Data

Dec. 30, 2005    (KR) .................. 10-2005-0135858

(51) Int. Cl.
*H01L 51/52* (2006.01)
(52) U.S. Cl. .................. 257/98; 257/E23.137
(58) Field of Classification Search .................. 257/98, 257/E23.137; 313/512, 504, 506
See application file for complete search history.

(56) References Cited

U.S. PATENT DOCUMENTS

| | | | |
|---|---|---|---|
| 4,238,704 A | 12/1980 | Bonk et al. | |
| 4,388,424 A * | 6/1983 | Kennell et al. | 523/219 |
| 5,882,761 A | 3/1999 | Kawami et al. | |
| 6,226,890 B1 | 5/2001 | Boroson et al. | |
| 6,437,769 B1 | 8/2002 | Kobayashi et al. | |
| 6,555,025 B1 | 4/2003 | Krupetsky et al. | |
| 6,570,325 B2 | 5/2003 | Graff et al. | |
| 6,580,223 B2 | 6/2003 | Konishi et al. | |
| 6,686,063 B2 | 2/2004 | Kobayashi | |
| 6,723,192 B2 | 4/2004 | Nagano et al. | |
| 6,750,606 B2 | 6/2004 | Kenmotsu | |
| 6,833,668 B1 | 12/2004 | Yamada et al. | |
| 6,853,126 B2 | 2/2005 | Nomura | |
| 6,992,330 B2 | 1/2006 | Fery et al. | |
| 6,998,776 B2 | 2/2006 | Aitken et al. | |
| 7,030,558 B2 * | 4/2006 | Park et al. | 313/512 |
| 2002/0180371 A1 * | 12/2002 | Yamazaki et al. | 315/169.3 |

(Continued)

FOREIGN PATENT DOCUMENTS

CN    1317922    10/2001

(Continued)

OTHER PUBLICATIONS

Office Action dated May 4, 2007 of related U.S. Appl. No. 11/529,948.

(Continued)

*Primary Examiner* — Evan Pert
*Assistant Examiner* — Selim Ahmed
(74) *Attorney, Agent, or Firm* — Knobbe Martens Olson & Bear LLP (57) ABSTRACT

Disclosed is an organic light emitting device which includes a substrate; a encapsulation substrate, an organic light emitting unit interposed between the substrate and the encapsulation substrate. A water vapor absorption material-containing transparent sealant layer covers the organic light emitting unit. The sealant layer includes a transparent sealant having a water vapor transmission rate (WVTR) of about 20 g/m²·day or less and a water vapor absorption material having an average particle size of about 100 nm or less.

9 Claims, 7 Drawing Sheets

U.S. PATENT DOCUMENTS

| | | |
|---|---|---|
| 2003/0027369 A1 | 2/2003 | Yamazaki |
| 2003/0037677 A1* | 2/2003 | Boroson et al. ............... 96/108 |
| 2003/0076039 A1 | 4/2003 | Ookawa et al. |
| 2003/0104753 A1* | 6/2003 | Graff et al. ..................... 445/24 |
| 2003/0218422 A1* | 11/2003 | Park et al. ...................... 313/512 |
| 2004/0150332 A1 | 8/2004 | Hwang et al. |
| 2004/0225025 A1* | 11/2004 | Sullivan et al. ............... 522/71 |
| 2005/0233885 A1 | 10/2005 | Yoshida et al. |
| 2005/0248270 A1 | 11/2005 | Ghosh et al. |
| 2005/0277355 A1 | 12/2005 | Choi et al. |
| 2006/0004140 A1* | 1/2006 | Asano et al. ................... 525/31 |
| 2006/0022592 A1* | 2/2006 | Boroson ......................... 313/512 |
| 2006/0119669 A1* | 6/2006 | Sharma et al. ................. 347/82 |
| 2007/0013292 A1* | 1/2007 | Inoue et al. .................... 313/504 |
| 2007/0090759 A1* | 4/2007 | Choi et al. ...................... 313/512 |

FOREIGN PATENT DOCUMENTS

| | | | |
|---|---|---|---|
| CN | 1459996 | | 12/2003 |
| JP | 09-050250 A | | 2/1997 |
| JP | 09-134781 A | | 5/1997 |
| JP | 9-148066 A | | 6/1997 |
| JP | 09-278483 A | | 10/1997 |
| JP | 10-074583 A | | 3/1998 |
| JP | 11-329717 A | | 11/1999 |
| JP | 2000-100561 A | | 4/2000 |
| JP | 2001-085155 | | 3/2001 |
| JP | 2002-056970 | | 2/2002 |
| JP | 2002-198173 | | 7/2002 |
| JP | 2003-109750 A | | 4/2003 |
| JP | 2004-71549 | | 3/2004 |
| JP | 2004-079208 | | 3/2004 |
| JP | 2004-107450 | | 4/2004 |
| JP | 2004-265615 A | | 9/2004 |
| JP | 2005-122910 A | | 5/2005 |
| JP | 2005-213316 | | 8/2005 |
| JP | 2005-320404 | | 11/2005 |
| KR | 10-2003-0096517 A | | 12/2003 |
| KR | 10-2004-0001064 A | | 1/2004 |
| KR | 10-2004-0073695 A | | 8/2004 |
| KR | 10-2005-0024592 A | | 3/2005 |
| KR | 10-2005-0031659 A | | 4/2005 |
| WO | WO 03/106582 | | 12/2003 |
| WO | WO 2004071134 | * | 8/2004 |
| WO | WO 2005/122644 | | 12/2005 |

OTHER PUBLICATIONS

Office Action dated Oct. 22, 2007 of related U.S. Appl. No. 11/529,948.

Chinese Office Action for Application No. 200610156676.5; Applicant: Samsung Mobile Display Co., Ltd., dated Dec. 4, 2009; 19 pgs.

Japanese Office Action for Appl. No. JP 2006-355470; Applicant: Samsung Mobile Display Co., Ltd., dated Feb. 9, 2010; 5 pgs.

Extended European Search Report for European Patent No. 06256597.3 issued by the European Patent Office dated Jan. 28, 2011, 10 pages.

* cited by examiner

ORGANIC LIGHT EMITTING DEVICE

CROSS-REFERENCE TO RELATED PATENT APPLICATIONS

This application claims the benefit of Korean Patent Application No. 10-2005-0135858, filed on Dec. 30, 2005, in the Korean Intellectual Property Office, the disclosure of which is incorporated herein by reference in its entirety.

BACKGROUND

1. Field of the Invention

The present invention relates to an organic light emitting device, and more particularly, to encapsulating an organic light emitting device.

2. Discussion of the Related Technology

Organic light emitting devices deteriorate when water vapor and/or oxygen permeate thereto. Accordingly, there is a need to encapsulate organic light emitting devices to attain a stable operation and a long lifetime. For example, generally, metal cans or glass having grooves are prepared in a cap-like form. Then, water vapor absorption materials that are used to absorb water vapor are placed in the grooves in powder. Alternatively, water vapor absorption materials are formed into films and then adhered to the grooves using dual adhesive tapes.

Japanese patent Laid-open publication No. hei 9-148066 discloses an organoelectric light emitting display device, wherein an organic emission layer is interposed between a pair of electrodes facing each other, and such a stacked structure is encapsulated from an external environment by an airtight container containing a drying agent, such as alkali metal oxide or alkali earth metal oxide. However, the organoelectric light emitting display device is bulky due to the shape of the airtight container. In addition, even when the drying agent absorbs water vapor and retains its solid state, the drying agent becomes opaque. Therefore, the organoelectric light emitting display device cannot be used as a front emission type light emitting device.

U.S. Pat. No. 6,226,890 discloses an organoelectric light emitting device including a water vapor absorption material layer formed using a water vapor absorption material and a binder, wherein the water vapor absorption material includes solid particles having an average particle size of 0.1 to 200 μm.

SUMMARY

An aspect of the invention provides an organic light emitting device, which may comprise: a first substrate; a second substrate comprising an interior surface opposing the first substrate; an array of organic light emitting pixels interposed between the first substrate and the second substrate, the array comprising a top surface facing the second substrate; and a film structure comprising a substantially transparent portion interposed between the second substrate and the array, wherein the portion contacts the interior surface and the top surface, wherein the portion comprises a desiccant, wherein the film structure interconnects the first substrate and the second substrate.

In the foregoing device, the second substrate may comprise a single layer of glass. The device may be configured to emit visible light through the second substrate. The substantially transparent portion may have a transmittance of about 85% or higher with respect to visible light. The substantially transparent portion may have a transmittance of about 95% or higher with respect to visible light. The desiccant may be in the form of particles sized about 1,000 nm or less. The portion may comprise a filler and the desiccant particles are dispersed in the filler. The portion may comprise a filler having a water vapor transmission rate (WVTR) equal or less than about 20 g/m$^2$·day. The WVTR is measured using a film of the sealant having a thickness of 100 μm in an environment at the temperature of 38° C. and the relative humidity of 100%, wherein the sealant is substantially transparent.

The filler may comprise at least one polymeric resin selected from the group consisting of acryl based resins, methacryl based resins, polyisoprene based resins, vinyl based resins, epoxy based resins, urethane based resins, cellulose based resins, titania, silicon oxide, zirconia, alumina, an epoxy silane, a vinyl silane, an amine silane, a methacrylate silane, an aryl silane, and a methalcryloxy silane. The desiccant may comprise at least one selected from the group consisting of $Li_2O$, $Na_2O$, $K_2O$, $BaO$, $CaO$, $MgO$, $Li_2SO_4$, $Na_2SO_4$, $CaSO_4$, $MgSO_4$, $CoSO_4$, $Ga_2(SO_4)_3$, $Ti(SO_4)_2$, $NiSO_4$, $CaCl_2$, $MgCl_2$, $SrCl_2$, $YCl_2$, $CuCl_2$, $CsF$, $TaF_5$, $NbF_5$, $LiBr$, $CaBr_3$, $CeBr_4$, $SeBr_2$, $VBr_2$, $MgBr_2$, $BaI_2$, $MgI_2$, $Ba(ClO_4)_2$, $Mg(ClO_4)_2$ and $P_2O_5$. The portion may have a thickness from about 10 μm to about 40 μm, wherein the thickness is measured in a direction, which defines the shortest distance between the first and second substrates.

Still in the foregoing device, the array may comprise a first electrode, a second electrode and an organic light emitting material interposed between the first and second electrodes, wherein the first electrode has a first distance from the first substrate, and the second electrode has a second distance from the first substrate, wherein the second distance is greater than the first distance, and wherein the top surface may be a surface of the second electrode facing the second substrate. The film structure may comprise a protective layer interposed between the array and the transparent layer, wherein the protective layer is configured to substantially inhibit components of the transparent layer from diffusing into the array. The film structure may comprise another portion interposed between the first and second substrates while not interposed between the array and the second substrate. The first substrate may comprise an interior surface opposing the second substrate, wherein the array is not interposed between the second substrate and the interior surface of the first substrate, wherein the other portion may be attached to the interior surfaces of the first and second substrates. The film structure may be attached to the interior surface of the second substrate and the top surface of the array.

Another aspect of the invention provides a method of making an organic light emitting device, which may comprise: providing a first substrate and an array of organic light emitting pixels formed on the first substrate with or without at least one intervening layer therebetween; arranging a second substrate to oppose the first substrate; interposing a composition between the first substrate and the second substrate, the composition comprising a curable material and a desiccant; and curing the curable material to form a film structure, wherein a film structure comprising a substantially transparent portion interposed between the second substrate and the array, wherein the film structure interconnects the first substrate and the second substrate.

In the foregoing method, the desiccant may be in the form of particles sized about 1,000 nm or less. The film structure may have a transmittance of about 85% or higher with respect to visible light. The film structure may comprise another portion interposed between the first and second substrates while not interposed between the array and the second substrate.

An aspect of the present invention provides an organic light emitting device having a good water vapor absorption capability including a water vapor absorption material-containing transparent sealant layer to be suitable for a front type emission type display device, and a method of manufacturing the same.

An aspect of the present invention provides an organic light emitting device including: a substrate; a encapsulation substrate; an organic light emitting unit interposed between the substrate and the encapsulation substrate; and a water vapor absorption material-containing transparent sealant layer that covers the organic light emitting unit, the sealant layer including: a transparent sealant having a water vapor absorption rate (WVTR) of about 20 g/m²·day or less; and at least one water vapor absorption material selected from the group consisting of metal oxide and metal salt having average particle sizes of about 100 nm or less.

Another aspect of the present invention provides a method of manufacturing an organic light emitting device, the method including: forming an organic light emitting unit sequentially comprising a first electrode, an organic layer, and a second electrode, on a substrate; coating on a surface of a encapsulation substrate a water vapor absorption material-containing transparent sealant layer forming composition comprising a transparent sealant having a water vapor transmission rate (WVTR) of about 20 g/m²·day or less, at least one water vapor absorption material selected from the group consisting of metal oxide and metal salt having average particle sizes of 100 nm or less, and a solvent; and combining the resulting encapsulation substrate with the substrate and curing the composition, to obtain a water vapor absorption material-containing transparent sealant layer that covers the organic light emitting unit. The WVTR is measured using a film of the sealant having a thickness of 100 μm in an environment at the temperature of 38° C. and the relative humidity of 100%, wherein the sealant is substantially transparent.

The water vapor absorption material-containing transparent sealant layer of the organic light emitting device according to an embodiment of the present invention has high transmittance; prevents permeation of external water vapor and oxygen into the organic light emitting device; and effectively adsorbs water vapor and/or oxygen that has already permeated into the organic light emitting device because the water vapor absorption material-containing transparent sealant layer includes at least one water vapor absorption material of nano-sized metal oxide and nano-sized metal salt, so that the permeated water vapor and/or oxygen cannot contact an organic light emitting unit. As a result, an organic light-emitting device having a long lifetime can be obtained.

Another aspect of the invention provides an organic light emitting device, which comprises: a first substrate; a second substrate comprising an interior surface opposing the first substrate; an array of organic light emitting pixels interposed between the first substrate and the second substrate, the array comprising a top surface facing the second substrate; and a film structure comprising a substantially transparent portion interposed between the second substrate and the array, wherein the portion contacts the interior surface and the top surface, wherein the portion comprises a desiccant and a body forming material, wherein the film structure interconnects the first substrate and the second substrate, wherein the body forming material has a water vapor transmission rate (WVTR) equal or less than about 20 g/m²·day, and wherein the desiccant is in the form of particles sized about 1,000 nm or less.

In the foregoing device, the second substrate may comprise a single layer of glass. The device may be configured to emit visible light through the second substrate. The substantially transparent portion may have a transmittance of about 85% or higher with respect to visible light. The substantially transparent portion may have a transmittance of about 95% or higher with respect to visible light. The desiccant may be in the form of particles sized about 1,000 nm or less. The portion may comprise a body forming material and the desiccant particles may be are dispersed in the body forming material. The portion may comprise a body forming material having a water vapor transmission rate (WVTR) equal or less than about 20 g/m²·day. The body forming material may comprise at least one polymeric resin selected from the group consisting of acryl based resins, methacryl based resins, polyisoprene based resins, vinyl based resins, epoxy based resins, urethane based resins, cellulose based resins, titania, silicon oxide, zirconia, alumina, an epoxy silane, a vinyl silane, an amine silane, a methacrylate silane, an aryl silane, and a methalcryloxy silane. The desiccant may comprise at least one selected from the group consisting of $Li_2O$, $Na_2O$, $K_2O$, $BaO$, $CaO$, $MgO$, $Li_2SO_4$, $Na_2SO_4$, $CaSO_4$, $MgSO_4$, $CoSO_4$, $Ga_2(SO_4)_3$, $Ti(SO_4)_2$, $NiSO_4$, $CaCl_2$, $MgCl_2$, $SrCl_2$, $YCl_2$, $CuCl_2$, $CsF$, $TaF_5$, $NbF_5$, $LiBr$, $CaBr_3$, $CeBr_4$, $SeBr_2$, $VBr_2$, $MgBr_2$, $BaI_2$, $MgI_2$, $Ba(ClO_4)_2$, $Mg(ClO_4)_2$ and $P_2O_5$. The portion may have a thickness from about 10 μm to about 40 μm, wherein the thickness is measured in a direction, which defines the shortest distance between the first and second substrates.

Still in the foregoing device, the array may comprise a first electrode, a second electrode and an organic light emitting material interposed between the first and second electrodes, wherein the first electrode has a first distance from the first substrate, and the second electrode has a second distance from the first substrate, wherein the second distance is greater than the first distance, and wherein the top surface may be a surface of the second electrode facing the second substrate. The film structure may comprise a protective layer interposed between the array and the transparent layer, wherein the protective layer is configured to substantially inhibit components of the transparent layer from diffusing into the array. The film structure may comprise another portion interposed between the first and second substrates while not interposed between the array and the second substrate. The first substrate may comprise an interior surface opposing the second substrate, wherein the array is not interposed between the second substrate and the interior surface of the first substrate, wherein the other portion may be attached to the interior surfaces of the first and second substrates. The film structure may be attached to the interior surface of the second substrate and the top surface of the array.

Another aspect of the invention provides a method of making an organic light emitting device, which may comprise: providing a first substrate and an array of organic light emitting pixels formed on the first substrate with or without at least one intervening layer therebetween; arranging a second substrate to oppose the first substrate; interposing a composition between the first substrate and the second substrate, the composition comprising a curable material and a desiccant; and curing the curable material to form a film structure, wherein a film structure comprising a substantially transparent portion interposed between the second substrate and the array, wherein the film structure interconnects the first substrate and the second substrate.

In the foregoing method, the desiccant may be in the form of particles sized about 1,000 nm or less. The film structure may have a transmittance of about 85% or higher with respect to visible light. The film structure may comprise another portion interposed between the first and second substrates while not interposed between the array and the second substrate. Interposing the composition may comprise forming the composition on the second substrate and arranging the first and second substrates such that the composition is interposed between the first and second substrates. The curable material may have a water vapor transmission rate (WVTR) equal or less than about 20 g/m²·day. The curable material may comprise at least one polymeric resin selected from the group consisting of acryl based resins, methacryl based resins, polyisoprene based resins, vinyl based resins, epoxy based resins, urethane based resins, cellulose based resins, titania, silicon oxide, zirconia, alumina, an epoxy silane, a vinyl silane, an amine silane, a methacrylate silane, an aryl silane, and a methalcryloxy silane.

An aspect of the present invention provides an organic light emitting device having a good water vapor absorption capability including a water vapor absorption material-containing transparent sealant layer to be suitable for a front type emission type display device, and a method of manufacturing the same.

An aspect of the present invention provides an organic light emitting device including: a substrate; a encapsulation substrate; an organic light emitting unit interposed between the substrate and the encapsulation substrate; and a water vapor absorption material-containing transparent sealant layer that covers the organic light emitting unit, the sealant layer including: a transparent sealant having a water vapor absorption rate (WVTR) of about 20 g/m²·day or less; and at least one water vapor absorption material selected from the group consisting of metal oxide and metal salt having average particle sizes of about 100 nm or less.

Another aspect of the present invention provides a method of manufacturing an organic light emitting device, the method including: forming an organic light emitting unit sequentially comprising a first electrode, an organic layer, and a second electrode, on a substrate; coating on a surface of a encapsulation substrate a water vapor absorption material-containing transparent sealant layer forming composition comprising a transparent sealant having a water vapor transmission rate (WVTR) of about 20 g/m²·day or less, at least one water vapor absorption material selected from the group consisting of metal oxide and metal salt having average particle sizes of 100 nm or less, and a solvent; and combining the resulting encapsulation substrate with the substrate and curing the composition, to obtain a water vapor absorption material-containing transparent sealant layer that covers the organic light emitting unit.

The water vapor absorption material-containing transparent sealant layer of the organic light emitting device according to an embodiment of the present invention has high transmittance; prevents permeation of external water vapor and oxygen into the organic light emitting device; and effectively adsorbs water vapor and/or oxygen that has already permeated into the organic light emitting device because the water vapor absorption material-containing transparent sealant layer includes at least one water vapor absorption material of nano-sized metal oxide and nano-sized metal salt, so that the permeated water vapor and/or oxygen cannot contact an organic light emitting unit. As a result, an organic light-emitting device having a long lifetime can be obtained.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS

Hereinafter, various embodiments of the present invention will be described in detail with reference to the attached drawings.

An organic light emitting device according to an embodiment of the present invention includes a water vapor absorption material-containing transparent sealant layer, which is suitable for a front emission type light emitting device. The water vapor absorption material-containing transparent sealant layer covers an organic light emitting unit, and allows a substrate on which the organic light emitting unit is formed to combine with a encapsulation substrate.

The water vapor absorption material-containing transparent sealant layer includes a transparent sealant or filler. The transparent sealant has a high light transmittance required to produce a front emission type light emitting device; and a low water vapor transmission rate (WVTR) to prevent permeation of water vapor and/or oxygen into the organic light emitting device to contact the organic light emitting unit. The WVTR is measured using a film of the sealant having a thickness of 100 μm in an environment at the temperature of 38° C. and the relative humidity of 100%, wherein the sealant is substantially transparent. In addition, the transparent sealant has a proper adhesive force to combine the substrate on which the organic light emitting unit is formed with the encapsulation substrate.

The transparent sealant may be selected such that the water vapor absorption material-containing transparent sealant layer including the transparent sealant has a transmittance of about 90% or more, for example, about 95% or more with respect to visible light. The transparent sealant may have a low WVTR of about 20 g/m²·day or less in some embodiments, about 10 g/m²·day or less in some embodiment, and about 1 g/m²·day to about 10 g/m²·day in one embodiment. When the WVTR of the sealant is about 20 g/m²·day or less, although not limited thereto, the water vapor/oxygen transmission in the sealant layer can be sufficiently delayed or prevented so as to avoid early saturation of water vapor absorption material.

The transparent sealant having the WVTR described above may be an organic sealant, an inorganic sealant, an organic/inorganic composite sealant, or a mixture thereof. The organic sealant may be a small molecule or polymer having the WVTF described above including at least one resin selected from an acryl based resin, a methacryl based resin, a polyisoprene based resin, a vinyl based resin, an epoxy based resin, a urethane based resin, and a cellulose based resin, and must be easily mixed with a water vapor absorption material, which will be described later, and easily formed into a film. For example, the organic sealant may be an epoxy based resin containing epoxy group.

The acryl based resin may be butylacrylate, ethylhexylacrylate, or the like; the methacryl based resin may be propyleneglycolmethacrylate, tetrahidrofufuryl methacrylate, or the like; the vinyl based resin may be vinylacetate, N-vinylpyrrolidone, or the like; the epoxy based resin may be cycloaliphatic epoxide, epoxy acrylate, vinyl epoxy based resin, or the like; the urethane based resin may be urethane acrylate or the like; and the cellulose based resin may be cellulosenitrate, or the like. However, the acryl based resin, the methacryl based resin, the polyisoprene based resin, the vinyl based resin, the epoxy based resin, the urethane based resin, and the cellulose based resin are not limited thereto. For example, the organic sealant may be epoxy acrylate or a vinyl epoxy based resin.

The inorganic sealant may be an inorganic material having the WVTR described above, such as metallic or non-metallic material containing silicon, aluminum, titanium, or zirconium, and must be easily mixed with a water vapor absorption material, which will be described later, and easily formed into a film. For example, the inorganic sealant may include at least one material selected from titania, silicon oxide, zirconia, alumina, and precursors of these. Examples of the precursors include Ti alkoxide such as Ti(OPr)$_4$, Si alkoxide such as Si(OEt)$_4$ or Zr alkoxide such as Zr(OBu)$_4$.

The organic/inorganic composite sealant is an organic/inorganic composite having the WVTR described above in which a metallic or non metallic material, such as silicon, aluminum, titanium, or zirconium, is connected to an organic material through a covalent bond, and must be easily mixed with a water vapor absorption material, which will be described later, and easily formed into a film. For example, the organic/inorganic composite sealant may includes at least one sealant selected from an epoxy silane or derivative thereof, a vinyl silane or derivative thereof, an amine silane or derivative thereof, a methacrylate silane or derivative thereof, an aryl silane or derivative thereof, a methalcryloxy silane or derivative thereof, and a partially curing product thereof. In particular, by using the partially curing product thereof, physical properties, such as viscosity, of a composition can be adjusted.

The epoxy silane or derivative thereof may be 3-glycidoxypropyltrimethoxysilane or a polymer thereof, or epoxy silicate. The vinyl silane or derivative thereof may be vinyltriethoxysilnae or a polymer thereof. The amine silane or derivative thereof may be 3-aminopropyltriethoxysilnae or a polymer thereof. The methacrylate silane or derivative thereof may be 3-(trimethoxysilyl)propyl acrylate or a polymer thereof. The aryl silane or derivative thereof may be a phenyl silane or a polymer thereof. For example, the organic/inorganic composite sealant may be epoxy silane, vinyl silane, aryl silane, methacryloxy silane, or the like.

Meanwhile, the water vapor absorption material-containing transparent sealant layer according to an embodiment of the present invention includes, in addition to the transparent sealant described hereinbefore, at least one water vapor absorption material or desiccant material selected from the group consisting of metal oxide and metal salt having average diameters of 100 nm or less. The metal oxide reacts with water vapor so that a metal-oxygen-metal bonding of the metal oxide is broken to form a metal hydroxide. As a result, water vapor is removed. In the metal salt, water vapor may coordinate at an unoccupied coordination site of a central metal, thereby forming a stable compound. As a result, water vapor is removed. Meanwhile, the at least one water vapor absorption material selected from metal oxide and metal salt may adsorb, in addition to water vapor, other chemical substances, such as oxygen, which deteriorate an organic light emitting device when contacts an organic light emitting unit.

Accordingly, the organic light emitting device including the water vapor absorption material-containing transparent sealant layer according to an embodiment of the present invention is protected from permeation of water vapor and/or oxygen by the transparent sealant having a low WVTR. In addition, even when a very small amount of water vapor and/or oxygen permeate into the organic light emitting device, the permeated vapor and/or oxygen is substantially, perfectly removed by the water vapor absorption material contained in the water vapor absorption material-containing transparent sealant layer. As a result, no water vapor and/or oxygen contacts the organic light emitting unit of organic light emitting device interposed between a substrate and a encapsulation substrate.

In addition, the metal oxide and/or metal salt, which is a water vapor absorption material, can adsorb water vapor and gas components generated when a curing process is performed to form a water vapor absorption material-containing transparent sealant layer. Therefore, dark spots that are generated when an organic light emitting device initially operates can be effectively prevented.

The metal oxide and/or metal salt according to an embodiment of the present invention is pulverized using a physical or chemical method such that an average particle size thereof is about 100 nm or less. The average particle size of the metal oxide and/or metal salt may be about 100 nm or less, for example, in the range of about 50 to about 90 nm. When the average particle size is about 100 nm or smaller, although not necessarily limited thereto, scattering in a visible light region can minimized so as to result in a high transmittance of the visible light.

The metal oxide and/or metal salt may include at least one material selected from alkali metal oxide, alkali earth metal oxide, metal halide, metal sulfate, metal perchlorate, and phosphorus pentoxide ($P_2O_5$). Particularly, the alkali metal oxide is $Li_2O$, $Na_2O$, or $K_2O$; the alkali earth metal oxide is BaO, CaO, or MgO; the metal sulfate is $Li_2SO_4$, $Na_2SO_4$, $CaSO_4$, $MgSO_4$, $CoSO_4$, $Ga_2(SO_4)_3$, $Ti(SO_4)_2$, or $NiSO_4$; the metal halide is $CaCl_2$, $MgCl_2$, $SrCl_2$, $YCl_2$, $CuCl_2$, CsF, $TaF_5$, $NbF_5$, LiBr, $CaBr_3$, $CeBr_4$, $SeBr_2$, $VBr_2$, $MgBr_2$, $BaI_2$, or $MgI_2$; and the metal perchlorate is $Ba(ClO_4)_2$ or $Mg(ClO_4)_2$. However, the alkali metal oxide, the alkali earth metal oxide, the metal sulfate, the metal halide, and the metal perchlorate are not limited thereto. For example, the water vapor absorption material may be CaO, BaO, or $P_2O_5$.

The transparent sealant of the water vapor absorption material-containing transparent sealant layer including the water vapor absorption material and the transparent sealant may have an amount of about 1000 parts by weight to about 4000 parts by weight, for example, about 1500 parts by weight to about 3500 parts by weight, per about 100 parts by weight of the water vapor absorption material. When the sealant is more than about 1000 parts by weight, although not necessarily limited thereto, transmission of water vapor and/or oxygen can be sufficiently delayed or prevented. Also, if the sealant is less than about 4000 parts by weight, although not necessarily limited thereto, the sealant layer can be designed sufficiently thin, resulting in thin organic light emitting devices. The water vapor absorption material-containing transparent sealant layer may have a thickness of about 10 µm to about 40 µm in certain embodiments, about 10 µm to about 30 µm in some embodiments, and about 20 µm in one embodiment. When the thickness of the sealant layer is about 10 µm or greater, although not necessarily limited thereto, water vapor transmission can be sufficiently delayed or prevented, and the amount of water vapor that can reach the organic light emitting device can be maintained small. Further, an appropriate range of the thickness of the sealant layer will maintain structural strength of the device, which makes damage to the organic light emitting device less likely, while not significantly increasing the overall thickness of the device.

The water vapor absorption material-containing transparent sealant layer may have transmittance of about 90% or more in certain embodiments, about 90% to about 99% in some embodiments, and about 95% to about 99% in one embodiment. Accordingly, the water vapor absorption material-containing transparent sealant layer is suitable for producing a front emission type light emitting device. In certain embodiments, the transmittance of the layer may be about 85, 86, 87, 88, 89, 90, 91, 92, 93, 94, 95, 95.5, 96, 96.5, 97, 97.5, 98, 98.5, 99, 99.5 or 100% with respect to visible light. In some embodiments, the transmittance of the layer may be within a range defined by two of the foregoing transmittances.

The water vapor absorption material-containing transparent sealant layer may include, in addition to the water vapor absorption material including metal oxide and/or metal salt and the transparent sealant, a dispersant. The dispersant facilitates dispersion of the water vapor absorption material and the transparent sealant when they are mixed. The dispersant may be a low molecular weight organic dispersant, a high molecular weight organic dispersant, a low molecular weight organic/inorganic complex dispersant, a high molecular weight organic/inorganic complex dispersant, an organic acid, or the like. The dispersant prevents formation of a cluster of metal oxide and/or metal salt particles exiting in the water vapor absorption material-containing transparent sealant layer by coherence, thereby allowing the metal oxide and/or metal salt to exist in a nano size in the water vapor absorption material-containing transparent sealant layer. As described above, the metal oxide and/or metal salt particles can uniformly disperse in a nano size, and thus transmittance of the water vapor absorption material-containing transparent sealant layer increases.

To disperse the fine particles in the solution without aggregation and precipitation, two methods can be used. In the first method, surfaces of the particles are positively or negatively charged and, due to electrostatic repulsive forces between the charged particles, the aggregation of the particles can be prevented. In this method, the particles can be easily dispersed in the solution and if the particles are required to have electrical properties, the particles can be dispersed without changing the electrical properties of the particles. However, the electrical repulsive forces are weak and are greatly affected by the pH of the solution, and thus, the dispersibility can be easily lowered. In the second method, the particles are surrounded by high molecular weight dispersants, and due to steric hindrance between them, the particles are not aggregated. In this method, a wide range of solvents can be used regardless of their polarity and dispersion stability is high. However, particles having electrical properties cannot be used in this method and the used dispersant is expensive. The dispersant of the water vapor absorption material dispersion used in an embodiment of the present invention has a high molecular weight, and thus, when the dispersant is mixed with the binder, the dispersibility can be maintained and the solution can be uniformly mixed.

The amount of the dispersant is in the range of about 0.1 parts by weight to about 100 parts by weight, for example, about 1 part by weight to about 100 parts by weight, per about 100 parts by weight of at least one water vapor absorption material of the metal oxide and the metal salt. The dispersant can be selected from any known dispersants. For example, the dispersant may be epoxy cyclo hexyl trimethoxy silane, methacryloxy propyl trimethoxy silane, or the like, but is not limited thereto.

Figure 1:
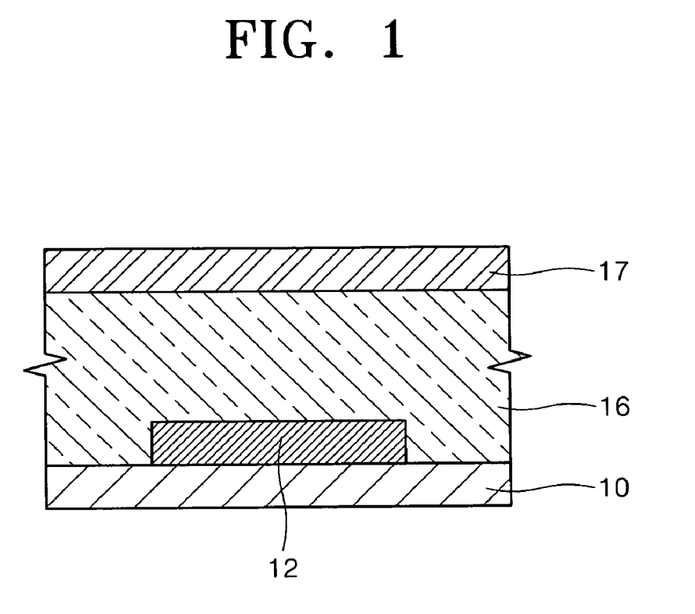
FIGS. 1 and 2 are sectional views of an organic light emitting device according to an embodiment of the present invention.

FIG. 1 is a sectional view of an organic light emitting device according to an embodiment of the present invention. Referring to FIG. 1, the organic light emitting device includes: a substrate 10; an organic light emitting unit 12 that is disposed on one surface of the substrate 10 and includes a first electrode, an organic layer, and a second electrode sequentially layered; a encapsulation substrate 17 combined to the substrate 10 to seal an internal space between the substrate 10 and the encapsulation substrate 17, in which the organic light emitting unit 12 is contained, from the outside, and a water vapor absorption material-containing transparent sealant layer 16 covering the organic light emitting unit 12 interposed between the substrate on which the organic light emitting unit 12 is formed and the encapsulation substrate 17.

As described above, the water vapor absorption material-containing transparent sealant layer 16 prevents permeation of external water vapor and oxygen into the organic light emitting device. In addition, the water vapor absorption material-containing transparent sealant layer 16 adsorbs even small amount of water vapor and/or oxygen that have permeated into the organic light emitting device and outgassing generated when the sealant layer is cured. Therefore, water vapor and/or oxygen substantially do not contact the organic light emitting unit 12. Accordingly, an organic light emitting device including the water vapor absorption material-containing transparent sealant layer 16 has a long lifetime. The water vapor absorption material-containing transparent sealant layer 16 is already described in detail above.

Figure 2:
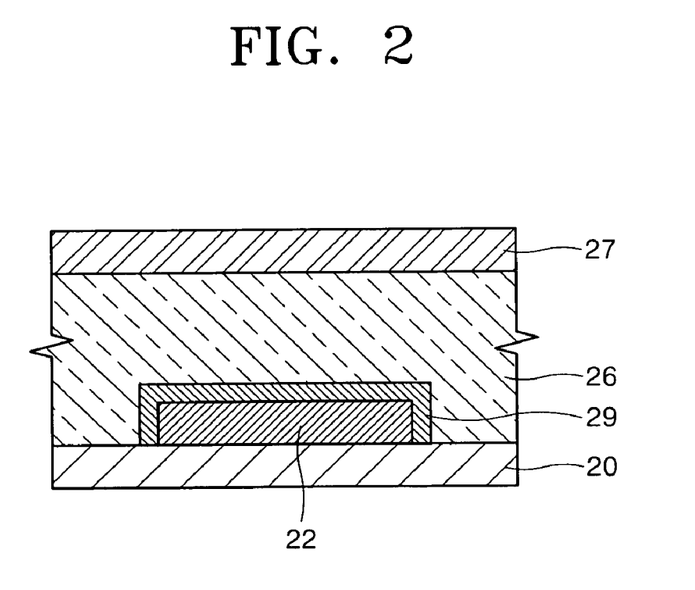

FIG. 2 is a sectional view of an organic light emitting device according to another embodiment of the present invention. Referring to FIG. 2, the organic light emitting device includes a substrate 20; an organic light emitting unit 22 sequentially including a first electrode, an organic layer, and a second electrode formed on one surface of the substrate 20; a encapsulation substrate 27 that is combined with the substrate 20 to seal organic light emitting unit 22 from an external environment, so that an inner space in which the organic light emitting unit 22 is placed is sealed; a water vapor absorption material-containing transparent sealant layer 26 covering the organic light emitting unit 22 interposed between the substrate 20 on which the organic light emitting unit 22 is formed and the encapsulation substrate 27; and a protecting layer 29 covering the organic light emitting unit 22.

The protecting layer 29 provides a heat resistant property, a chemical resistant property, a water vapor transmission preventing property so that permeation of water vapor and/or oxygen into the organic light emitting unit can be prevented. The protecting layer 29 may be an inorganic layer or a multi layer formed by alternatively depositing an inorganic layer and an organic layer. However, the structure of the protecting layer 29 is not limited thereto.

The inorganic layer of the protecting layer may include at least one metal oxide selected from silicon nitride, aluminum nitride, zirconium nitride, titanium nitride, hafnium nitride, tantalum nitride, silicon oxide, aluminum oxide, titanium oxide, tin oxide, ceruim oxide, and silicon oxynitride (SiON). However, the inorganic layer is not limited thereto. The organic layer of the protecting layer may include a cross linked unit of a benzocyclobutene containing compound or a hydrosilsesquioxane. However, the organic layer is not limited thereto. The inorganic layer and organic layer of the protecting layer will be referred to Korean Laid-open Patent Publication No. 10-2005-0077919, which is incorporated in the present specification as a reference.

In FIGS. 1 and 2, each of the organic light emitting units 12 and 22 includes the first electrode, the organic layer, and the second electrode sequentially deposited. The first electrode may act as an anode and the second electrode may act as a cathode. Alternatively, the first electrode may act as a cathode and the second electrode may act as an anode. The organic layer includes a hole injection layer, a hole transport layer, an emission layer, and electron injection layer, and/or an electron transport layer. The first electrode, the organic layer, and the second electrode may be formed using various known materials through various known depositing methods or coating methods, such as an inkjet printing method.

In FIGS. 1 and 2, the encapsulation substrates 17 and 27 may be an insulating glass or transparent plastic substrate. In some embodiments, the substrates 17 and 27 may be a single layer of glass or plastic resin. When a transparent plastic substrate is used, a protecting layer is further formed to protect the inner surface of the plastic substrate from water vapor. The protecting layer has a heat resistant property, a chemical resistant property, and a desiccating property. Such a transparent encapsulation substrate is suitable for a front emission type light emitting device.

In a rear emission type light emitting device, the first electrodes of the organic light emitting unit 12 and 22 are transparent electrodes, and the second electrodes of the organic light emitting unit 12 and 22 are reflective electrodes. In a front emission type light emitting device, the first electrodes of the organic light emitting unit 12 and 22 are reflective electrodes, and the second electrodes of the organic light emitting unit 12 and 22 are transparent electrodes. In a both direction emission type light emitting device, the first electrode and the second electrode are transparent electrodes. In this case, the first electrode is located closer to the substrates 10 and 20, and the second electrode is located closer to the encapsulation substrate 17 and 27.

A method of manufacturing an organic light emitting device including the water vapor absorption material-containing transparent sealant layer includes: forming an organic light emitting unit sequentially comprising a first electrode, an organic layer, and a second electrode, on a substrate; coating on a surface of a encapsulation substrate a water vapor absorption material-containing transparent sealant layer forming composition comprising a transparent sealant having a water vapor transmission rate (WVTR) of about 20 g/m²·day or less, at least one water vapor absorption material selected from the group consisting of metal oxide and metal salt having average particle sizes of about 100 nm or less, and a solvent; and combining the resulting encapsulation substrate to the substrate and curing the composition to obtain a water vapor absorption material-containing transparent sealant layer that covers the organic light emitting unit. The WVTR is measured using a film of the sealant having a thickness of 100 μm in an environment at the temperature of 38° C. and the relative humidity of 100%.

Figure 3A:
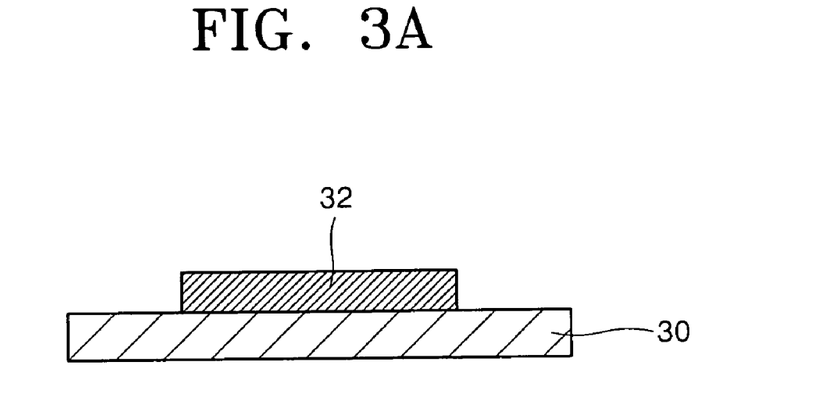
FIGS. 3A through 3C are views illustrating a method of manufacturing an organic light emitting device according to an embodiment of the present invention.
Figure 3B:
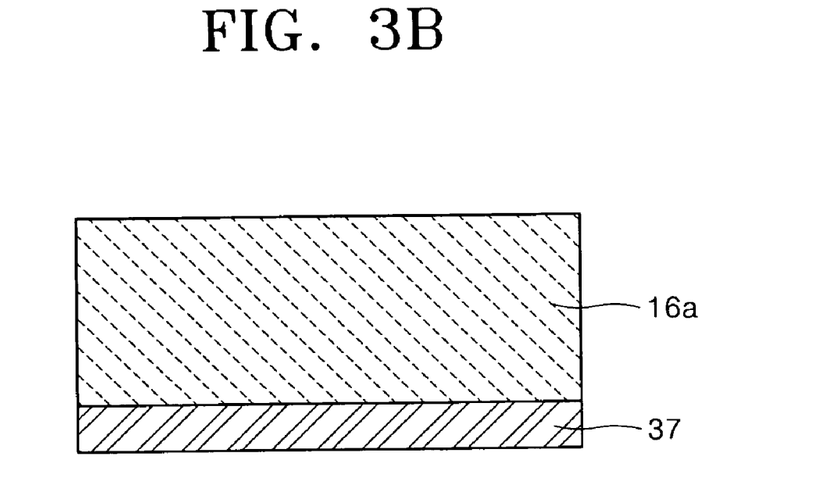
Figure 3C:
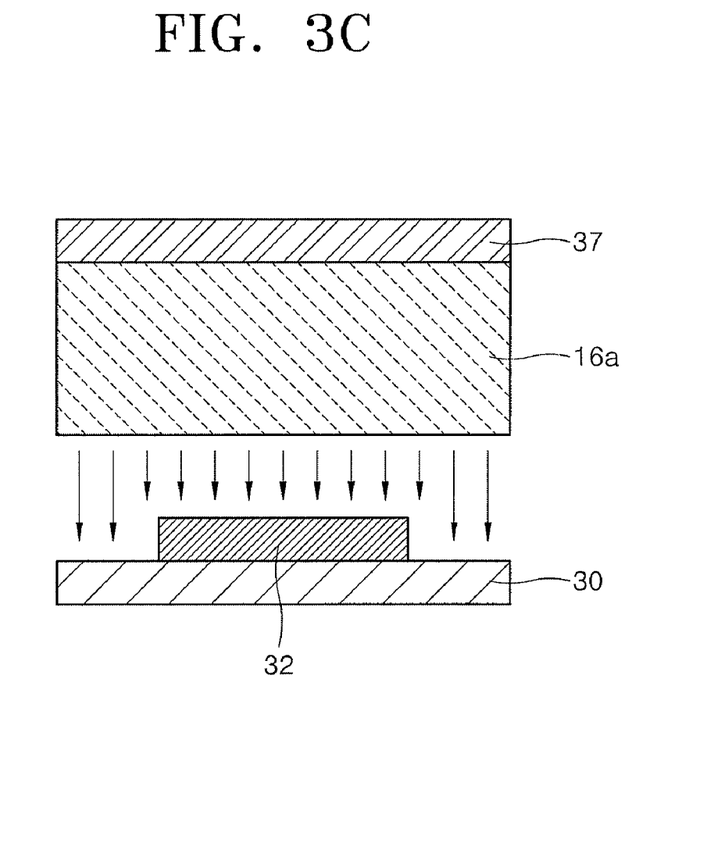

FIGS. 3A through 3C are views illustrating a method of manufacturing an organic light emitting device according to an embodiment of the present invention. First, as illustrated in FIG. 3A, an organic light emitting unit 32 including a first electrode, an organic layer, and a second electrode sequentially deposited is formed on a substrate 30. The substrate 30 and the organic light emitting unit 32 can be formed using various known materials and methods.

Then, prepared is a water vapor absorption material-containing transparent sealant layer forming composition 36a including: a transparent sealant having a water vapor absorption rate (WVTR) of about 20 g/m²·day or less, at least one water vapor absorption material selected from the group consisting of metal oxide and metal salt having average particle sizes of about 100 nm or less, and a solvent. As illustrated in FIG. 3B, the water vapor absorption material-containing transparent sealant layer forming composition 36a is coated on one surface of an encapsulation substrate 37.

A method of preparing the water vapor absorption material-containing transparent sealant layer forming composition 36a will now be described in detail. First, at least one water vapor absorption material selected from a metal oxide and a metal salt is mixed in a solvent and then the mixture is physically milled to attain a nano-sized (e.g. an average particle size of about 100 nm or less) mixture of the metal oxide and/or metal salt and the solvent. The resulting mixture is mixed with the transparent sealant, thereby producing the water vapor absorption material-containing transparent sealant layer forming composition 36a according to an embodiment of the present invention. In the water vapor absorption material-containing transparent sealant layer forming composition 36a, the solid amount is in the range of about 2 to about 25 wt % of the composition. With the solid amount greater than about 2 wt %, although not necessarily limited thereto, the resulting sealant layer will have sufficient desiccant activity. On the other hand, the solid amount smaller than about 25 wt % will maintain sufficient transmittance of the sealant layer with respect to visible light, although not necessarily limited thereto.

The coating may be dip coating, spin coating, spray coating, dispensing, or screen printing. For example, the coating is performed through screen printing, which is desirable in terms of workability.

In the water vapor absorption material-containing transparent sealant layer forming composition including the transparent sealant and the water vapor absorption material as described above, the amount of the transparent sealant may be in the range of about 1000 parts by weight to about 4000 parts by weight, for example, about 1500 parts by weight to about 3500 parts by weight, per about 100 parts by weight of the water vapor absorption material. With the transparent sealant in an amount about 1000 parts by weight or greater, although not necessarily limited thereto, the water vapor and oxygen transmission in the sealant layer can be sufficiently delayed or prevented. Also, with the transparent sealant in an amount about 4000 parts by weight or smaller, although not necessarily limited thereto, the thickness of the sealant layer can be maintained appropriately.

The solvent may be a solvent that can disperse metal oxide or metal salt particles. The solvent may include at least one material selected from ethanol, methanol, propanol, butanol, isopropanol, methyl ethyl ketone, propylene glycol (mono) methylether (PGM), isopropylcellulose (IPC), methylcellusolve (MC), and ethylcellosolve (EC), wherein the amount of the solvent is in the range of about 100 parts by weight to about 1900 parts by weight per about 100 parts by weight of the metal oxide or the metal salt.

The water vapor absorption material-containing transparent sealant layer forming composition may further include at least one dispersant including at least one selected from a low molecular weight organic dispersant, a high molecular weight organic dispersant, a low molecular weight organic/inorganic complex dispersant, a high molecular weight organic/inorganic complex dispersant, and an organic acid, wherein the amount of the dispersant is in the range of about 0.1 to about 100 parts by weight per about 100 parts by weight of at least one of the metal oxide and the metal salt.

Then, as illustrated in FIG. 3C, the water vapor absorption material-containing transparent sealant layer forming composition 36a coated on the encapsulation substrate 37 is combined with the organic light emitting unit 32 formed on the substrate 30, for example, in an arrow direction, thereby covering the organic light emitting unit 30. Then, the water vapor absorption material-containing transparent sealant layer forming composition 36a is cured to form a water vapor absorption material-containing transparent sealant layer covering the organic light emitting unit 32 as illustrated in FIG. 1. The curing is performed through thermal curing or UV curing. When thermally curing is used, the heat treatment temperature may be in the range of about 50° C. to about 200° C. The water vapor absorption material-containing transparent sealant layer prepared as described above retains its transparency before and after absorbing water vapor. With the temperature range of about 50° C. to about 200° C., although not necessarily limited thereto, the curing of the composition is optimized without affecting the specific surface property and the desiccant property of the resulting sealant layer.

Figure 4A:
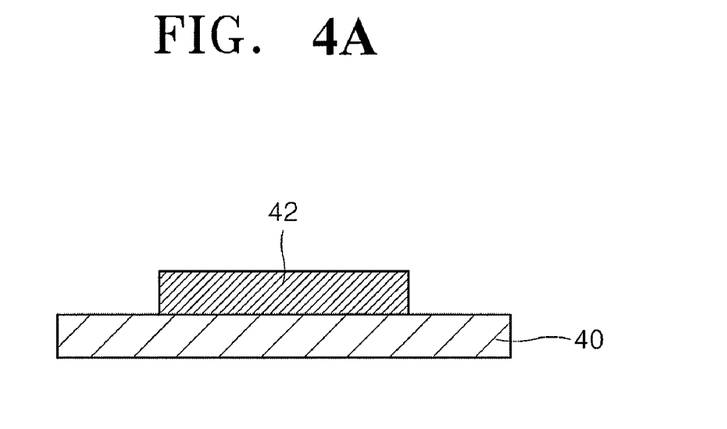
FIGS. 4A through 4D are views illustrating a method of manufacturing an organic light emitting device according to another embodiment of the present invention.

FIGS. 4A through 4D are views illustrating a method of manufacturing an organic light emitting device according to another embodiment of the present invention. First, as illustrated in FIG. 4A, an organic light emitting unit 42 including a first electrode, an organic layer, and a second electrode sequentially deposited is formed on a substrate 40. The substrate 40 and the organic light emitting unit 42 can be formed using various known materials and methods.

Figure 4B:
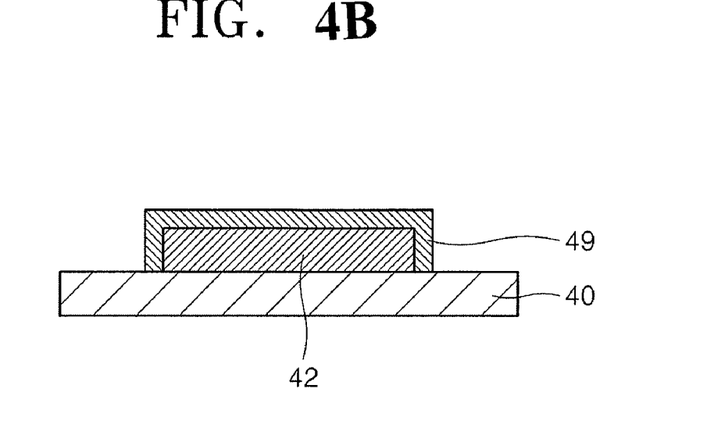

Then, as illustrated in 4B, the organic light emitting unit 42 is covered by a protecting layer 49. The protecting layer 49 provides a heat resistant property, a chemical resistant property, a desiccating property so that permeation of water vapor and/or oxygen into the organic light emitting unit can be prevented. The protecting layer 49 may be an inorganic layer or a multi layer formed by alternatively depositing an inorganic layer and an organic layer. However, the structure of the protecting layer 49 is not limited thereto. The protecting layer 49 is already described in detail hereinbefore.

Then, prepared is a water vapor absorption material-containing transparent sealant layer forming composition 46a including: a transparent sealant having a water vapor transmission rate (WVTR) of about 20 g/m$^2$·day or less, at least one water vapor absorption material selected from the group consisting of metal oxide and metal salt having average particle sizes of about 100 nm or less, and a solvent. The WVTR is measured using a film of the sealant having a thickness of 100 μm in an environment at the temperature of 38° C. and the relative humidity of 100%. As illustrated in FIG. 4B, the water vapor absorption material-containing transparent sealant layer forming composition 36a is coated on one surface of an encapsulation substrate 47.

Figure 4C:
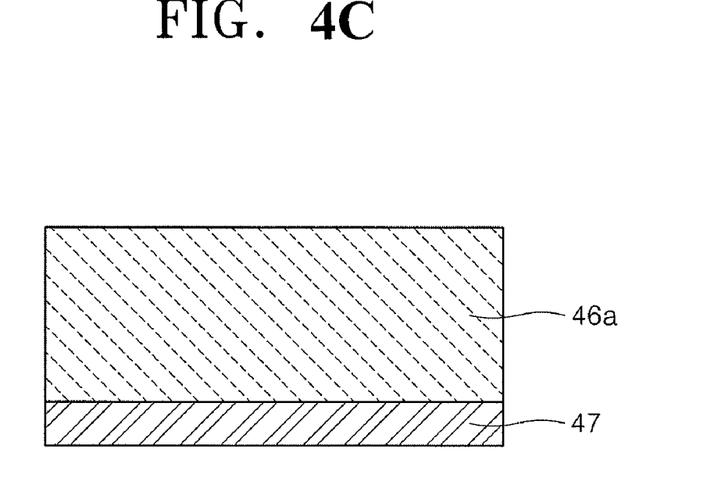
Figure 4D:
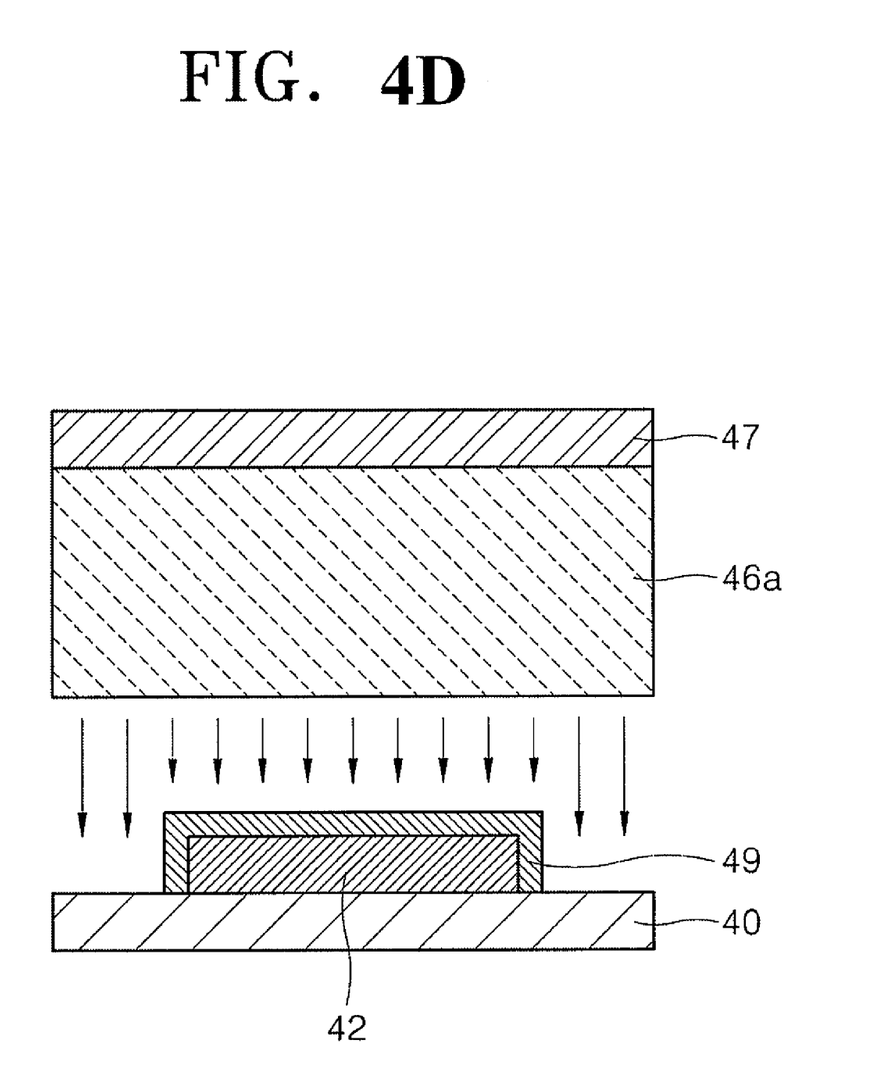

A method of preparing the water vapor absorption material-containing transparent sealant layer forming composition 46a is already described in detail hereinbefore. Then, as illustrated in FIG. 4C, the water vapor absorption material-containing transparent sealant layer forming composition 46a coated on the encapsulation substrate 47 is combined with the organic light emitting unit 42 formed on the substrate 40, for example, in an arrow direction, thereby covering the organic light emitting unit 40. Then, the cured water vapor absorption material-containing transparent sealant layer forming composition 46a is cured to form a water vapor absorption material-containing transparent sealant layer covering the organic light emitting unit 42 as illustrated in FIG. 1. The cured process is already described in detail hereinbefore. The water vapor absorption material-containing transparent sealant layer prepared as described above retains its transparency before and after absorbing water vapor.

The organic light emitting device according to an embodiment can be used in a front emission type light emitting device, a rear emission type light emitting device, and a both direction emission type light emitting device. The organic light emitting device according to an embodiment of the present invention may operate in various manners. For example, a passive matrix (PM) operation method and an active matrix (AM) operation method can be used for the organic light emitting device according to an embodiment of the present invention.

Embodiments of the present invention will be described in further detail with reference to the following examples. These examples are for illustrative purposes only and are not intended to limit the scope of the present invention.

Example 1

First, epoxy acrylate (EXS74-16, manufactured from TOAGOSEI Co., Ltd.) was prepared as an organic transparent sealant and a WVTR thereof was measured. In particular, the epoxy acrylate was coated on a glass substrate and then cured using ultraviolet (UV) light to form an epoxy acrylate film having a thickness of 100 μm. The film was separated from the glass substrate. The separated film was installed in a chamber in a nitrogen atmosphere. One surface of the film was covered with water vapor. A water vapor transmission rate (WVTR), which is a degree of water vapor transmission from one side to another side of the film, of the epoxy acrylate was measured using a MOCON apparatus (produced from MOCON Inc.) at temperature of 38° C. and relative humidity of 100%. As a result, the WVTR of epoxy acrylate was about 9.7 g/m$^2$·day.

Then, 100 parts by weight of anhydrous calcium oxide (CaO) (average particle size of 30 μm) and 9 parts by weight of epoxycyclohexyltrimethoxysilane, which was an organic/inorganic composite siloxane, were mixed with 400 parts by weight of anhydrous ethanol, and then the mixture was milled for 24 hours to obtain a dispersion solution having CaO particles having an average particle size of 70 nm. The dispersion solution was mixed with 2700 parts by weight of epoxy acrylate (EXS74-16, manufactured from TOAGOSEI Co., Ltd.), which was an organic transparent sealant, to prepare a water vapor absorption material-containing transparent sealant layer forming composition.

The water vapor absorption material-containing transparent sealant layer forming composition is coated on one side of a glass substrate (soda lime glass having a thickness of 0.7 mm, produced from Corning Precision Glass Inc.) through screen printing to a thickness of 20 μm.

Separately, a substrate including a first electrode, an organic layer, and a second electrode thereon was prepared. Then, the glass substrate coated with the water vapor absorption material-containing transparent sealant layer forming composition was combined with the substrate including the organic light emitting unit such that the water vapor absorption material-containing transparent sealant layer forming composition covered the organic light emitting unit. The attached structure was heat treated at 85° C. and then cured using UV light. As a result, an organic light emitting device including a transparent sealant layer that covers the organic light emitting unit, has a thickness of 20 μm, and has CaO particles having an average particle of 70 nm was prepared.

Figure 5:
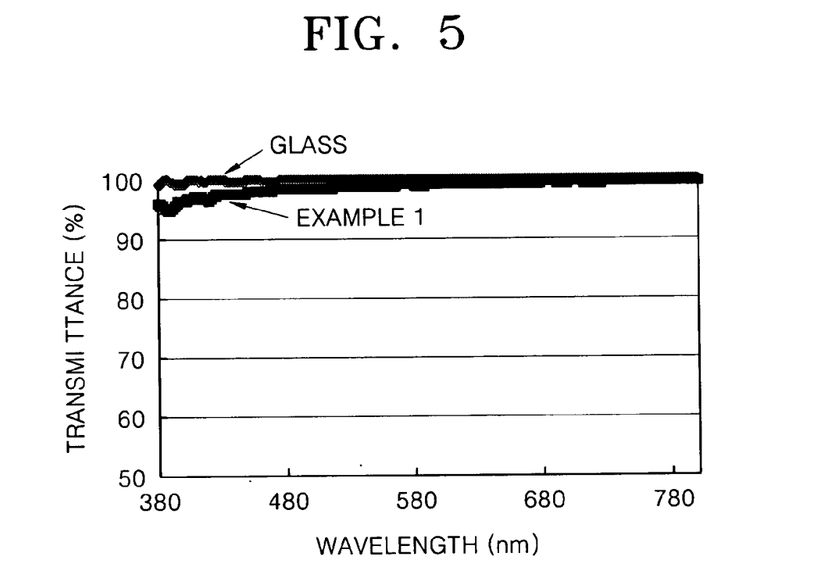
FIG. 5 is a graph of transmittance of a glass substrate and a water vapor absorption material-containing transparent sealant layer according to an embodiment of the present invention.

FIG. 5 is a graph of a transmittance spectrum of the CaO-containing transparent sealant layer obtained according to Example 1. The transmittance spectrum was measured using a photo transmittance analyzer (PSI Co., Ltd.). Referring to FIG. 5, the transmittance of the CaO-containing transparent sealant layer did not decrease in the entire visible region.

Example 2

An organic light emitting device was prepared in the same manner as in Example 1, except that the water vapor absorption material-containing transparent sealant layer forming composition included epoxy silicate (ORMOCER, produced from Fraunhofer Inc.) as an organic/inorganic composite transparent sealant instead of the epoxy acrylate as a transparent sealant. The WVTR of the epoxy silicate was measured in the same manner as in Example 1. As a result, the WVTR of the epoxy silicate was about 3 to 4 g/m²·day.

Example 3

An organic light emitting device was prepared in the same manner as in Example 1, except that a $SiO_2$ protecting layer having a thickness of 0.1 μm covered an organic light emitting unit including a first electrode, an organic layer, and a second electrode on a substrate.

Example 4

An organic light emitting device was prepared in the same manner as in Example 1, except that the water vapor absorption material-containing transparent sealant layer forming composition included barium oxide (BaO) having an average particle size of 50-80 nm instead of the anhydrous calcium oxide (CaO).

Example 5

An organic light emitting device was prepared in the same manner as in Example 1, except that the water vapor absorption material-containing transparent sealant layer forming composition included phosphorus pentoxide ($P_2O_5$) having an average particle size of 50-80 nm instead of the anhydrous calcium oxide (CaO).

Transmittance of water vapor absorption material-containing transparent sealant layers prepared according to Examples 4 and 5 was measured in the same manner as in Example 1. As a result, it was found that all of them have proper transparency suitable for a front emission type light emitting device.

Example 6

An organic light emitting device was prepared in the same manner as in Example 1, except that the transparent sealant layer forming composition that includes only the epoxy acylate as a transparent sealant was used instead of the water vapor absorption material-containing forming composition.

Example 7

An exemplary getter (HD-204, produced from Japanese Dynic Inc.) was installed on a soda glass substrate. An epoxy resin as a sealant was coated on one surface of the soda glass substrate and one surface of a glass substrate on which a first electrode, an organic layer, and a second electrode. Subsequently, these two substrates were combined together. The attached structure was heat treated at 100° C. and cured using UV light to produce an organic light emitting device.

Example 8

Figure 6:
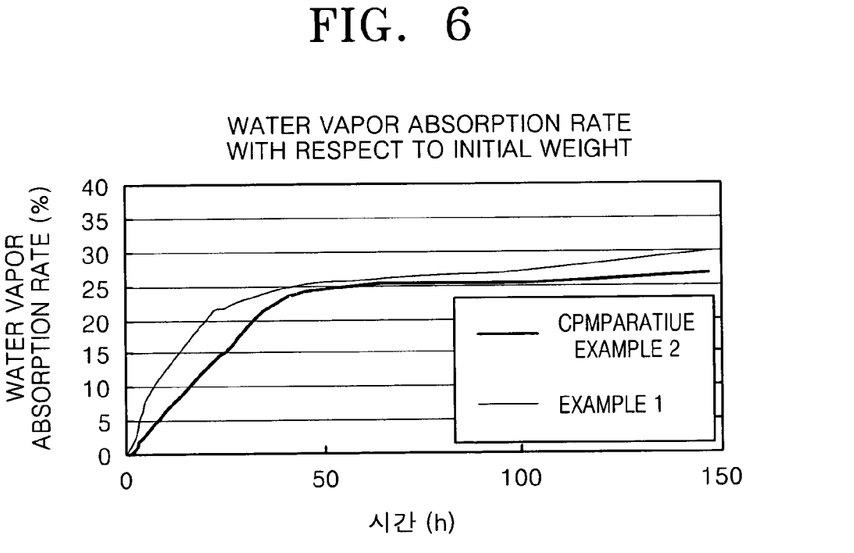
FIG. 6 is a graph of water vapor absorption rates of an exemplary organic light emitting device and an organic light emitting device according to an embodiment of the present invention.

Water vapor absorption rates of the organic light emitting devices prepared according to Example 1 and Example 7 were measured. The results are shown in FIG. 6. In this case, a precision balance capable of calculating down to the fifth decimal place was used.

Referring to FIG. 6, the organic light emitting device prepared according to Example 1 exhibited higher water vapor absorption rate and faster water vapor transmission speed than the organic light emitting device prepared according to Example 7. In particular, the organic light emitting device prepared according to Example 1 captured up to 30 parts by weight of water vapor per 100 parts by weight of the water vapor absorption material.

Water vapor absorption rates of the organic light emitting devices prepared according to Examples 2 through 5 were measured. As a result, it was found that the organic light emitting devices prepared according to Examples 2 through 5 exhibited similar water vapor absorption rate to the organic light emitting devices prepared according to Example 1.

Example 9

Figure 7:
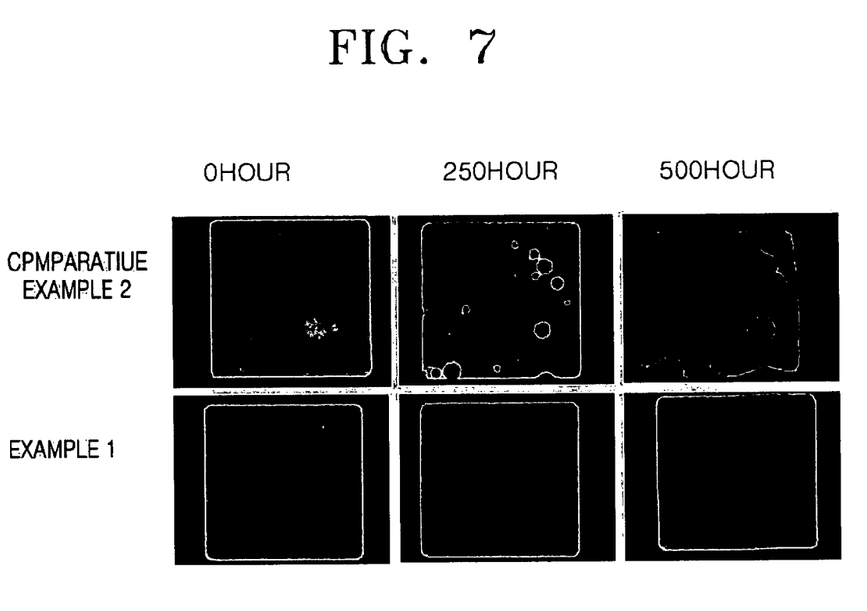
FIG. 7 shows an exemplary organic light emitting device and an organic light emitting device according to an embodiment of the present invention to measure lifetimes of respective devices.

Lifetime of the organic light emitting devices prepared according to Example 1 and Example 7 were measured. The results are shown in FIG. 7. In particular, in order to measure lifetime, the organic light emitting devices were left sit at 70° C. at a relative humidity of 90%, and screens of the organic light emitting devices were measured after 0 hour, after 250 hours, and after 500 hours.

Referring to FIG. 7, after 250 hours, the organic light emitting device prepared according to Example 7 exhibited many dark spots on its screen. After 500 hours, the number of the dark spots increased. Therefore, it was found that quality of the screen of the organic light emitting device prepared according to Example 7 decreased over time. However, the organic light emitting device prepared according to Example 1 exhibited substantially no dark spots even after 500 hours. Therefore, it was found that the organic light emitting device prepared according to Example 1 had an excellent screen quality.

Lifetimes of the organic light emitting devices prepared according to Examples 2 through 5 were measured at the same time interval as described above. As a result, it was found that the organic light emitting devices prepared according to Examples 2 through 5 exhibited the similar lifetime to the organic light emitting devices prepared according to Example 1. That is, an organic light emitting device according to embodiments of the present invention had a longer lifetime than an exemplary organic light emitting device.

Effects of embodiments of the present invention will now be described in detail. First, a water vapor absorption material-containing transparent sealant layer including a transparent sealant and a water vapor absorption material, which is nano-sized metal oxide and/or metal salt, and having excellent photo transmittance covers an organic light emitting unit. Such a structure is suitable for a front emission type light emitting device. Secondly, the transparent sealant of the water vapor absorption material-containing transparent sealant layer has a very low water vapor absorption rate, so that permeation of water vapor and/or oxygen from an external environment into the organic light emitting device can be effectively prevented.

Thirdly, since the water vapor absorption material-containing transparent sealant layer includes a water vapor absorption material that is metal oxide and/or metal salt, the even small amount of water vapor and/or oxygen that have permeated into the organic light emitting device can be adsorbed to the water vapor absorption material. Therefore, compared to when an exemplary getter is used, the contact of water vapor and/or oxygen and the organic light emitting unit can be effectively prevented. Fourthly, since the water vapor absorption material-containing transparent sealant layer includes a water vapor absorption material that is metal oxide and/or metal salt, the water vapor absorption material adsorb a small amount of water vapor and a gas component generated when the transparent sealant is cured. As a result, formation of dark spots occurring when an organic light emitting device initially operates can be prevented. In addition, the organic light emitting device has a longer lifetime.

While various embodiments of the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting device comprising:
   a substrate;
   an encapsulation substrate;
   an organic light emitting unit interposed between the substrate and the encapsulation substrate; and
   a water vapor absorption material-containing sealant layer that covers and contacts at least a portion of the organic light emitting unit, the water vapor absorption material-containing sealant layer comprising:
   a sealant having a water vapor transmission rate (WVTR) of about 20 g/m²·day or less, wherein the WVTR is measured using a film of the sealant having a thickness of 100 μm in an environment at the temperature of 38° C. and the relative humidity of 100%, wherein the sealant is substantially transparent,
   a water vapor absorption material selected from the group consisting of metal oxide and metal salt having average particle sizes of about 100 nm or less;
   wherein the substrate and the encapsulation substrate are interconnected via the water vapor absorption material-containing sealant layer; and
   wherein the sealant having a water vapor transmission rate (WVTR) of about 20 g/m²·day or less comprises at least one of an acryl based resin and an epoxy silicate.

2. The organic light emitting device of claim 1, wherein the water vapor transmission rate is about 10 g/m²·day or less.

3. The organic light emitting device of claim 1, wherein the water vapor absorption material comprises at least one material selected from the group consisting of alkali metal oxide, alkali earth metal oxide, metal halide, metal sulfate, metal perchlorate, and phosphorus pentoxide ($P_2O_5$).

4. The organic light emitting device of claim 3, wherein the alkali metal oxide is $Li_2O$, $Na_2O$, or $K_2O$; wherein the alkali earth metal oxide is BaO, CaO, or MgO; wherein the metal sulfate is $Li_2SO_4$, $Na_2SO_4$, $CaSO_4$, $MgSO_4$, $CoSO_4$, $Ga_2(SO_4)_3$, $Ti(SO_4)_2$, or $NiSO_4$; wherein the metal halide is $CaCl_2$, $MgCl_2$, $SrCl_2$, $YCl_2$, $CuCl_2$, CsF, $TaF_5$, $NbF_5$, LiBr, $CaBr_3$, $CeBr_4$, $SeBr_2$, $VBr_2$, $MgBr_2$, $BaI_2$, or $MgI_2$; and wherein the metal perchlorate is $Ba(ClO_4)_2$ or $Mg(ClO_4)_2$.

5. The organic light emitting device of claim 1, wherein the water vapor absorption material is an anhydrous calcium oxide (CaO).

6. The organic light emitting device of claim 1, wherein the amount of the sealant is in the range of about 1000 parts by weight to about 4000 parts by weight based on 100 parts by weight of the water vapor absorption material.

7. The organic light emitting device of claim 1, wherein the thickness of the water vapor absorption material-containing sealant layer is in the range of about 10 μm to about 40 μm.

8. The organic light emitting device of claim 1, wherein the transmittance of visible light through the water vapor absorption material-containing sealant layer is in the range of about 90% to about 99%.

9. The organic light emitting device of claim 1, wherein the transmittance of visible light through the water vapor absorption material-containing sealant layer is in the range of about 95% to about 99%.

* * * * *